United States Patent
Nango

(10) Patent No.: US 8,332,579 B2
(45) Date of Patent: Dec. 11, 2012

(54) DATA STORAGE APPARATUS AND METHOD OF WRITING DATA

(75) Inventor: Takahiro Nango, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/077,283

(22) Filed: Mar. 31, 2011

(65) Prior Publication Data

US 2011/0296084 A1      Dec. 1, 2011

(30) Foreign Application Priority Data

May 31, 2010    (JP) .................................. 2010-125136

(51) Int. Cl.
   *G06F 12/00*     (2006.01)
(52) U.S. Cl. ................................... 711/103; 365/185.33
(58) Field of Classification Search .................. 711/103; 365/185.33
   See application file for complete search history.

(56) References Cited

U.S. PATENT DOCUMENTS

| | | | |
|---|---|---|---|
| 2007/0113001 A1 | 5/2007 | Yamada | |
| 2007/0143561 A1* | 6/2007 | Gorobets | 711/170 |
| 2008/0141043 A1* | 6/2008 | Flynn et al. | 713/193 |
| 2009/0300297 A1 | 12/2009 | Ikeuchi et al. | |
| 2010/0223423 A1* | 9/2010 | Sinclair et al. | 711/103 |

FOREIGN PATENT DOCUMENTS

| | | |
|---|---|---|
| JP | 07-244992 A | 9/1995 |
| JP | 2002-222120 | 8/2002 |
| JP | 2003-297088 A | 10/2003 |
| JP | 2007-102460 A | 4/2007 |
| JP | 2007-140733 A | 6/2007 |
| JP | 2009-015364 | 1/2009 |
| JP | 2009-289170 | 12/2009 |

OTHER PUBLICATIONS

Notice of Reasons for Rejection mailed by the Japan Patent Office on May 31, 2011 in the corresponding Japanese patent application No. 2010-125136 in 8 pages.

* cited by examiner

*Primary Examiner* — Hashem Farrokh
(74) *Attorney, Agent, or Firm* — Knobbe, Martens, Olson & Bear LLP

(57) ABSTRACT

According to one embodiment, a data storage apparatus includes a flash memory and a controller for controlling the flash memory. The flash memory is configured to store data is written in units of a prescribed size. In order to write data smaller than the prescribe size, the controller first isolates attribute data from each save data item of the prescribed size, which has been read from any flash memory, and then stores the attribute data to an attribute data memory, and finally transfers the user data contained in the save data, to a save data memory.

10 Claims, 4 Drawing Sheets

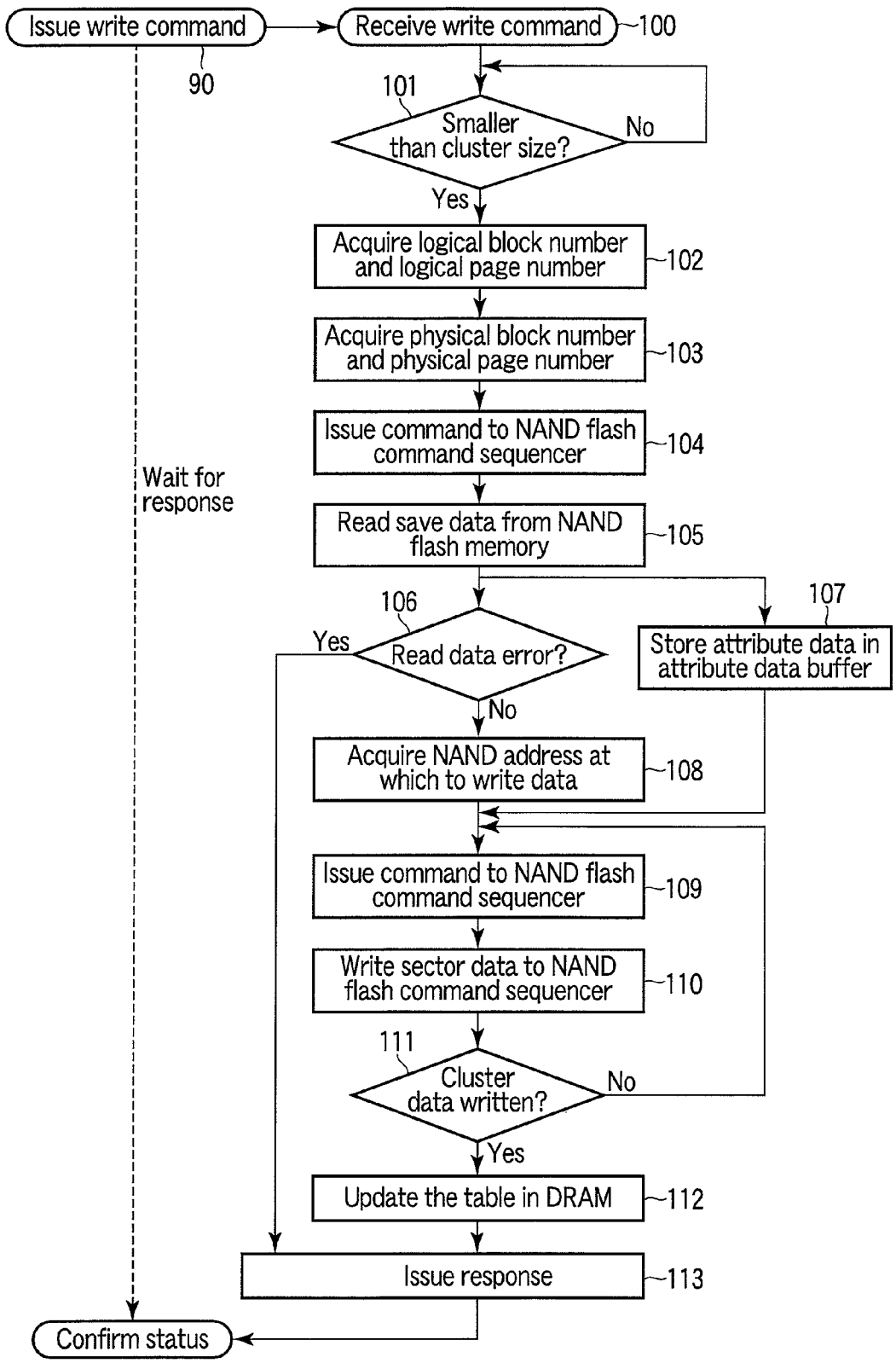
F I G. 3

DATA STORAGE APPARATUS AND METHOD OF WRITING DATA

CROSS-REFERENCE TO RELATED APPLICATIONS

This application is based upon and claims the benefit of priority from Japanese Patent Application No. 2010-125136, filed May 31, 2010; the entire contents of which are incorporated herein by reference.

FIELD

Embodiments described herein relate generally to a data storage apparatus that uses a nonvolatile memory as recording medium.

BACKGROUND

Solid-state drives (SSDs) have been developed as data storage apparatuses, each using NAND flash memories (hereinafter referred to as "flash memories" in some cases) that are rewritable nonvolatile memories. Data storage apparatuses for use in servers or enterprises, in particular, are implemented by SSDs of large storage capacity.

The SSD writes data to and reads data from the flash memories, in units of logical accesses called as "clusters." That is, a cluster is an amount of data that can be accessed to a flash memory at a time. In most SSDs, one cluster is composed of a plurality of sectors, each being a physical access unit. For example, it is composed of eight sectors. One type of an SSD is known, to and from which data can be written and read in units of sectors.

In the conventional SSD, only a part of any cluster (for example, three sectors) may be modified in a write operation. This mode of writing data is occasionally called "read modify write (RMW)."

In the RMW mode, cluster data (i.e., one data cluster) at an address to which data should be written is read from a flash memory, and then saved in a buffer memory. Of the data thus saved, the data to be modified (e.g., three sectors) is modified, generating new cluster data. The new cluster data is written at a write address of the flash memory.

In the RMW mode, the save data must be read from the flash memory and then transferred to the buffer memory. Therefore, in order to improve the performance of the data storage apparatus (i.e., SSD), the save data must be fast transferred, and the buffer memory must be quickly accessed. In other words, the save data should be processed at high efficiency in the RMW mode.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is a flowchart explaining how data is written in the embodiment;

DETAILED DESCRIPTION

Various embodiments will be described hereinafter with reference to the accompanying drawings.

In general, according to one embodiment, a data storage apparatus includes a flash memory and a controller for controlling the flash memory. The flash memory is configured to store data is written in units of a prescribed size. In order to write data smaller than the prescribe size, the controller first isolates attribute data from each save data item of the prescribed size, which has been read from any flash memory, and then stores the attribute data to an attribute data memory, and finally transfers the user data contained in the save data, to a save data memory.

Configuration of the Data Storage Apparatus

Figure 1:
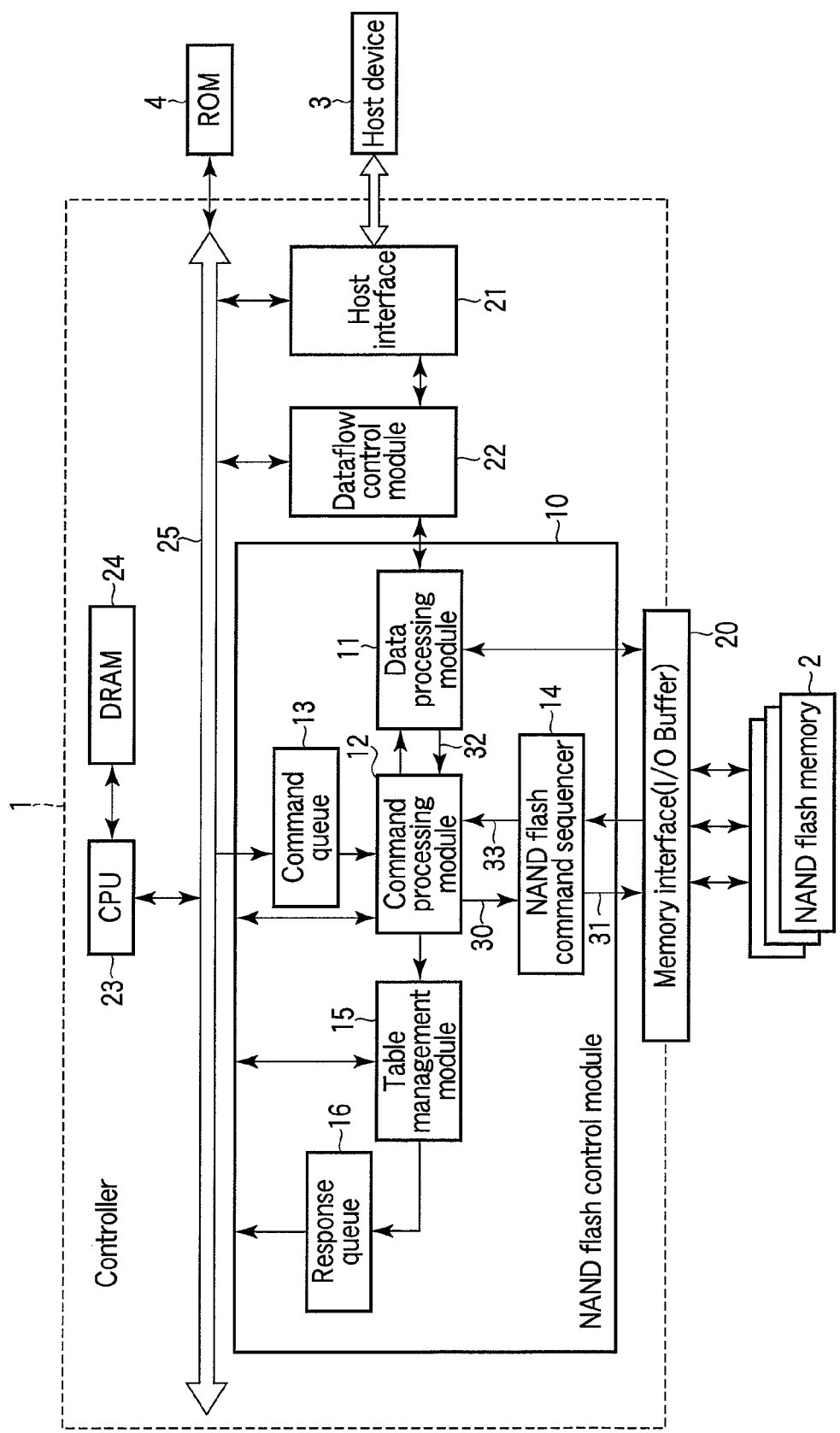
FIG. 1 is a block diagram explaining the configuration of a data storage apparatus according to an embodiment.

FIG. 1 is a block diagram explaining the configuration of a data storage apparatus according to an embodiment.

The data storage apparatus according to the embodiment is a solid-state drive (SSD) that uses NAND flash memories (flash memories) as recording media. As shown in FIG. 1, the data storage apparatus has a NAND memory controller chip (hereinafter referred to as a "controller") 1, a plurality of flash memories 2, and a boot read-only memory (ROM) 4. The boot ROM 4 is a flash memory and stores a boot program that enables an external apparatus to access the SSD.

The controller 1 has some major components, i.e., a NAND flash control module (hereinafter referred to as a "flash control module") 10, a memory interface 20, a host interface 21, a dataflow control module 22, a microprocessor (CPU) 23, a dynamic random access memory (DRAM) 24, and an internal bus 25.

Figure 2:
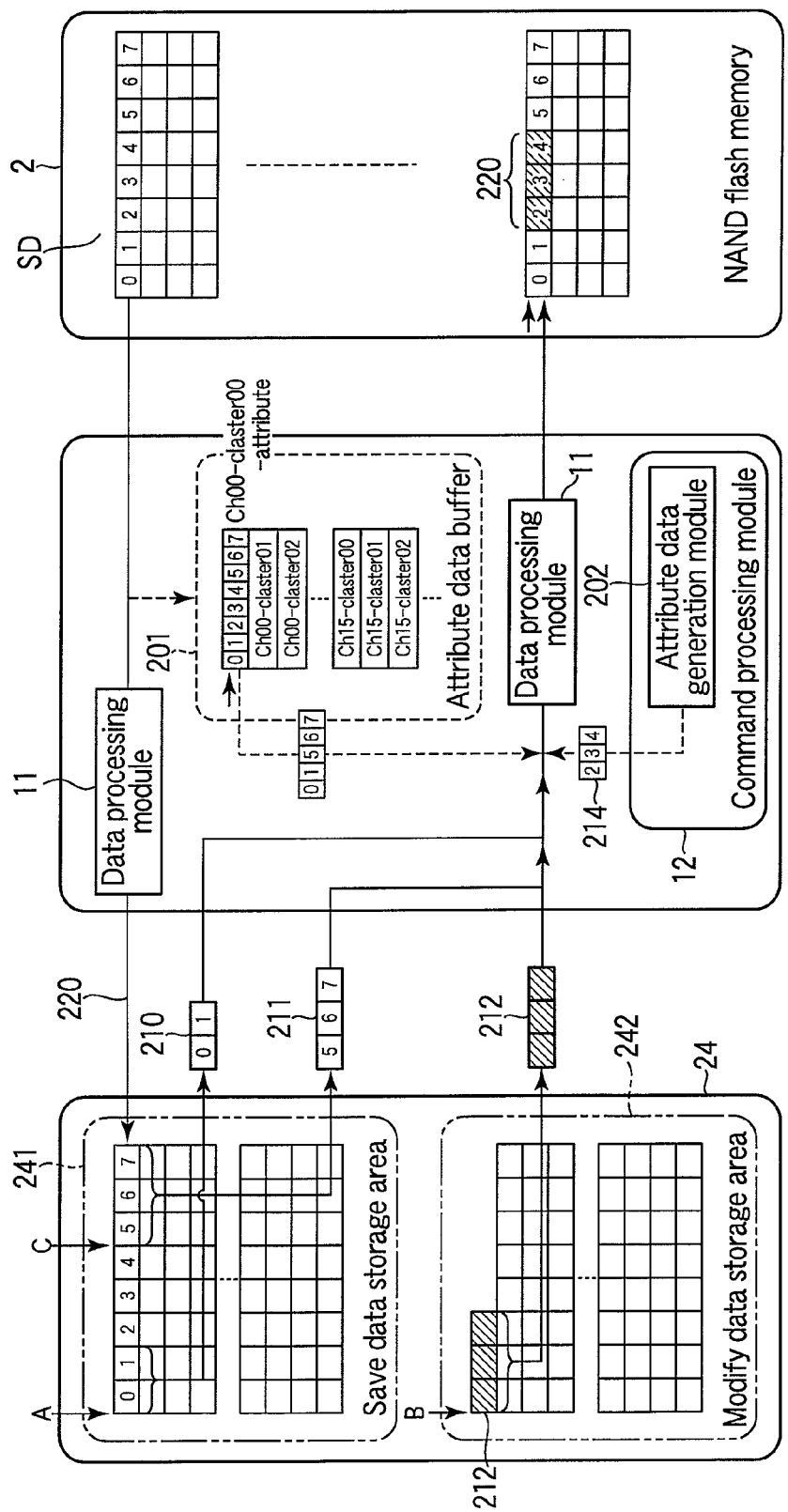
FIG. 2 is a block diagram explaining how data is written in the embodiment.

The CPU 23 is firmware, which is configured to output commands to the flash control module 10 in response to a command coming from the host device 3. The commands the CPU 23 outputs are indispensable to data writing and data reading. The DRAM 24 is a buffer memory, which is access-controlled by the CPU 23, and can store data to save (hereinafter called "save data"), data to modify (hereinafter called "modify data"), table data, etc. As shown in FIG. 2, the DRAM 24 has a save data storage area 241, in which save data may be stored, and a modify data storage area 242, in which modify data may be stored.

The memory interface 20 includes an input/output (I/O) buffer and controls the transfer of addresses and data between any flash memory 2 and the flash control module 10. The host interface 21 transmits and receives data and commands to and from the host device 3. The host device 3 connects the SSD and a computer, for example, a personal computer. The host device 3 is an interface controller conforming to, for example, the Serial Attached SCSI (SAS) standard or Serial ATA (SATA) standard. The dataflow control module 22 controls buffer storage of the data transferred by the host interface 21. The host device 3 uses logical addresses (LBAs) to access the NAND memories 2.

The flash control module 10 has a data processing module 11, a command processing module 12, a command queue 13, a NAND flash command sequencer (hereinafter referred to as a "command sequencer") 14, a table management module 15, and a response queue 16.

The data processing module 11 detects errors in data and performs error correction (e.g., the ECC process). The command processing module 12 is configured to decipher and execute the commands (including write commands) stored in the command queue 13. The command queue 13 is a matrix buffer and configured to store the instructions and write command supplied from the CPU 23. Note that the write command has undergone a read sequence process.

The command sequencer 14 is configured to select any one of the flash memories 2, and to issue an access command to any flash memory 2 selected. The table management module 15 updates the table data (e.g., conversion table for converting LBAs and physical addresses) stored in the DRAM 24. The response queue 16 gives command-end data and status data to the CPU 23.

Operation of the Data Storage Apparatus

How the data storage apparatus according to the embodiment operates will be explained with reference to FIG. 2, FIG. 3, FIG. 4 and FIG. 5.

In the embodiment, data is written and read to and from each flash memory 2 in units of clusters (i.e., logical accesses). One cluster is data of, for example, eight sectors. Each sector is a physical access unit and is, for example, 512 bytes of data.

Further, in this embodiment, when data smaller than one cluster (e.g., three sectors) is written to the flash memory 2, a write operation is called "read modify write (RMW)" is performed. In the RMW mode, data of e.g., three sectors, is modified in order to write data to any flash memory 2 in units of clusters.

First, the boot program is transferred from the boot ROM 4 to the memory incorporated in the CPU 23 or to the DRAM 24 when the system switch is turned on. Then, any software can access the data storage apparatus. How the flash control module 10 operates will be explained with reference to the flowcharts of FIGS. 2 and 3.

The CPU 23 issues a write command in response to the command transferred from the host device 3 (Block 90). On receiving the command from the CPU 23, the flash control module 10 starts the data transfer between the flash memories 2 and the DRAM 24.

Assume that a write command is supplied from the CPU 23 to the flash control module 10. Then, in the flash control module 10, the write command is stored in the command queue 13 (Block 100). The command processing module 12 acquires the write command from the command queue 13, detects that data transferred and smaller than one cluster should be modified, and determines whether the write command is the RMW mode (Block 101). Thus, if the data is smaller than one cluster (for example, three sectors), the command processing module 12 determines that the write command is the RMW mode.

The table management module 15 uses, as index, the block address LBA accompanying the write command, referring to the table (i.e., address management table) stored in the DRAM 24. The table management module 15 thereby acquires the physical block number (physical page number) of the data that should be saved (hereinafter called "save data"), and also the chip number of the flash memory 2 from which to read the data (Blocks 102 and 103).

In this embodiment, of the data stored in a flash memory 2, the cluster to read, designated by a logical block address LBA is composed of sectors at physical addresses SD0 to SD7 (physical block numbers) SD0 to SD7 as illustrated in FIG. 2.

Therefore, the flash control module 10 recognizes sectors SD0 to SD7 as data that should be saved.

In response to a read access command 30 coming from the command processing module 12, the command sequencer 14 issues a read command 31 for reading the save data (Block 104). The command 30 coming from the command processing module 12 contains physical addresses SD0 to SD7 and the address of the save data storage area 241 provided in the DRAM 24.

As shown in FIG. 2, the flash control module 10 reads the save data (sectors SD0 to SD7) from the flash memory 2 and transfers the same to the save data storage area 241 (Block 105). At this point, the data processing module 11 determines whether errors exist in the save data read from the flash memory (Block 106). If errors are detected in the ECC process (YES in Block 106), the data processing module 11 performs an ECC process, and issues a response to the CPU 23 via the response queue 16 (Block 113). The CPU 23 therefore interrupts the RMW.

When the save data is completely read from the flash memory 2, the command sequencer 14 informs the command processing module 12 that the save data has been read. At this point, the command sequencer 14 isolates attribute data and user data 200 from the save data, and transfers the attribute data to the command processing module 12 (see arrow 33 shown in FIG. 1).

Figure 5:
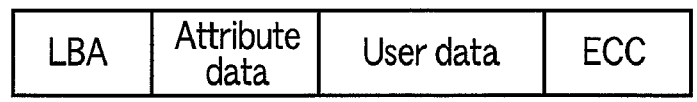
FIG. 5 is a diagram showing the data format utilized in the embodiment.

As shown in FIG. 5, each of the sectors (SD0 to SD7) has a data format composed of a logical address (LBA), attribute data, user data and ECC data. The attribute data is flag data that represents whether an ECC process should be performed on, for example, the user data in the ensuing write process.

As shown in FIG. 2, the command processing module 12 receives the attribute data and stores the same in an attribute data buffer 201, achieving pointer management (Block 107). The attribute data buffer 201 is a buffer area provided in the memory the flash control module 10 incorporates. As FIG. 2 shows, the command processing module 12 utilizes the chip number (Ch00) and cluster number (Cluster00), as pointer for convenience, thereby managing the pointer.

The command processing module 12 isolates the user data 200 from the save data and transfers the user data 200 to the save data storage area 241 provided in the DRAM 24. The command processing module 12 holds and manages the address of the save data storage area 241.

How the ensuing write process is performed will be explained, with reference to Block 108 et seq. shown in FIG. 3.

First, the command processing module 12 acquires the write physical address of the flash memory 2, which has been set, via the CPU 23, in the register area provided in the memory the flash control module 10 incorporates (Block 108).

As shown in FIG. 2, the cluster data written in the RMW mode is composed of the user data (SD0, SD1) 210, user data (SD5 to SD7) 211 and the modify data 212 in the present embodiment. The user data (SD0, SD1) 210, user data (SD5 to SD7) are stored in the save data storage area 241. The modify data 212 is stored in the modify data storage area 242.

The command processing module 12 issues, to the command sequencer 14, a write command 30 containing address A of the save data storage area 241 provided in the DRAM 24 (Block 109). The write command 30 designates the flash memory 2 to which data should be written. The command processing module 12 gives the command sequencer 14 the address of the attribute data of sectors SD0 and SD1, which is stored in the attribute data buffer 201.

The command sequencer 14 calculates transfer-start sector SD0 and the number of sectors to transfer, i.e., 2, from address A of the save data storage area 241, and reads the user data for sectors SD0 and SD1 designated. Note that transfer-start sector SD0 and the number of sectors are defined by the argument of the command. The command sequencer 14 then issues a write command 31 to the flash memory 2, whereby data is written to the flash memory 2 (Block 110). At this point, the command sequencer 14 adds the attribute data stored in the attribute data buffer 201, to the user data for sectors SD0 and SD1 read, and writes the data composed of the user data and the attribute data, generating composite data. The composite data is written to the flash memory 2. The data processing module 11 adds ECC data.

Next, the command processing module 12 issues, to the command sequencer 14, a write command 30 containing address A of the save data storage area 241 provided in the DRAM 24 (Block 109, if NO in Block 111). The command processing module 12 also outputs, to the command sequencer 14, the attribute data for the modify data SD2 to SD4 generated by an attribute data generation module 202.

The command sequencer 14 calculates transfer-start sector SD0 and the number of sectors, both defined by the argument of the command, from address B of the modify data storage area 242, and then reads the user data (i.e., modify data) for sectors SD2 to SD4 designated. The command sequencer 14 issues a write command 31 to the flash memory 2, whereby data is written to the flash memory 2 (Block 110). At this point, the command sequencer 14 adds the attribute data generated by the attribute data generation module 202, to the modify data for sectors SD2 to SD4, thus read, generating modified data 220. The modified data 220 is written to the flash memory 2. The data processing module 11 adds ECC data.

The command processing module 12 issues, to the command sequencer 14, a write command 30 containing address C of the save data storage area 241 provided in the DRAM 24 (Block 109, if NO in Block 111). The command processing module 12 also notifies the command sequencer 14 of the address of attribute data for sectors SD5 to SD7, which is stored in the attribute data buffer 201.

The command sequencer 14 calculates the from address C of the save data storage area 241 from transfer-start sector SD5 and the number of sectors, i.e., 3, both defined by the argument of the command, and then reads the user data for sectors SD5 to SD7 designated. The command sequencer 14 issues a write command 31 to the flash memory 2, whereby data is written to the flash memory 2 (Block 110). At this point, the command sequencer 14 adds the attribute data 213 stored in the attribute data buffer 201, to the user data for sectors SD5 to SD7, thus read, generating modified data. The modified data is written to the flash memory 2. The data processing module 11 adds ECC data.

The command processing module 12 issues a command twice or four times in accordance with the amount of modify data. When the cluster data is completely written to the flash memory 2 (YES in Block 111), the command processing module 12 notifies this even to the table management module 15 and gives the module 15 the data indispensable to the updating of various table. The table management module 15 updates the table data stored in the DRAM 24 (Block 112) and issues end data and status data to the response queue 16 (Block 113). From the data supplied from the response queue 16, the CPU 23 determines that the data has been correctly written to the flash memory 2.

As has been described, the user data and the attribute data are isolated from each other in this embodiment, in order to save data from any flash memory, in the RMW mode of modifying, if any, data smaller than one cluster. In the read process, the controller 1 isolates the user data and attribute data from the save data read from the flash memory. The controller 1 stores the attribute data into the attribute data buffer 201 and transfers the user data to the save data storage area 241. In the write process, the controller 1 merges the save data (i.e., user data) stored in the save data storage area 241 with the modify data stored in the modify data storage area 242, generating composite data. The composite data is written to the flash memory 2.

Since only the user data is transferred to the save data storage area 241 in this embodiment, the time of accessing the DRAM 24 to modify the attribute data can be shorter than in the case where both the save data and the attribute data are transferred to the save data storage area 241. That is, the DRAM 24 can be fast accessed to save data. This ultimately reduces the load on the CPU 23. As a result, the efficiency of processing the save data will increase.

In the ordinary read mode, the controller 1 transfers, to the host device 3, the data read from any flash memory and containing no attribute data. Both the transfer path for the save data in the RMW mode and the transfer path for the data in the ordinary read mode can therefore be used in the embodiment. This can reduce the circuitry size of the controller 1 and can lower the cost of verifying the operation of the controller 1.

Moreover, the CPU 23 only needs to issue the first write command, not only in the RMW mode (in which save data is read from the flash memory 2), but also in the write mode (in which data is written to the flash memory 2). Hence, the load on the CPU 23 is reduced. This improves the system performance of the SSD.

If no save data exists while the read modify write (RMW) is undergoing in an unwritten area of the flash memory, fixed data may be written to the save data storage area 241 provided in the DRAM 24. This embodiment can thereby be implemented. In this case, the attribute data may be the same as the command data set in the used in the write process set in the command queues 13.

OTHER EMBODIMENTS

Figure 4:
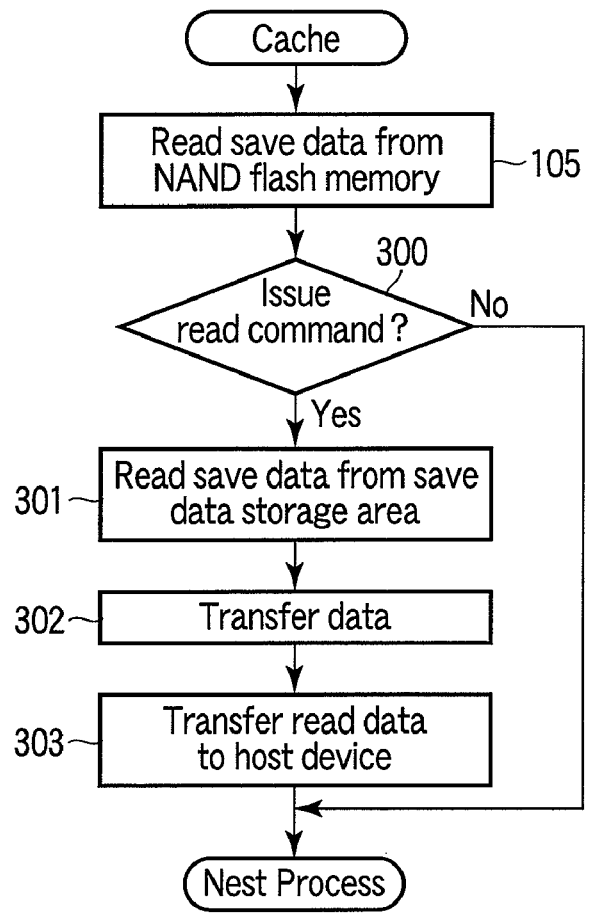
FIG. 4 is a flowchart explaining a cache operation performed in the embodiment.

FIG. 4 is a flowchart explaining another embodiment.

In this embodiment, the controller 1 reads save data (i.e., data isolated from the attribute data) from a flash memory 2 in the RMW mode and transfers the save data to the save data storage area 241 provided in the DRAM 24 (Block 105).

The host device 3 may give a read command to the controller 1. On receiving the read command, the controller 1 determines, from the LBA, whether the data to read as the read command requests for is stored in the save data storage area 241 (Block 300).

If the data is stored in the save data storage area 241, the controller 1 reads the user data (i.e., data for the sectors designated) stored in the save data storage area 241 (Block 301). The controller 1 then transfers this data to the host interface 21 (Block 302). The host interface 21 transfers the data to the host device 3 as the read command has requested (Block 303).

Of the save data transferred from the flash memory 2 to the save data storage area 241 of the DRAM 24 in the RMW mode of this embodiment, the data the host device 3 has requested for can thus be transferred to the host device 3. In this embodiment, the save data stored in the save data storage area 241 contains no attribute data as in the ordinary read mode.

Therefore, in this embodiment, the controller 1 can transfer data from the DRAM 24 (i.e., buffer memory) to the host device 3 at high speed in the RMW mode, without accessing to the flash memory 2, in response to a read command coming from the host device 3. In other words, the data storage area 241 of the DRAM 24 is used as a cache memory, whereby a cache process is performed, transferring the requested data to the host device 3 at high speed.

The various modules of the systems described herein can be implemented as software applications, hardware and/or software modules, or components on one or more computers, such as servers. While the various modules are illustrated separately, they may share some or all of the same underlying logic or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage apparatus comprising:
   a flash memory configured to store data written and read in units of a predetermined size, the data of the predetermined size comprising a plurality of minimal unit data items, each including user data and attribute data indicative of a data attribute; and
   a controller configured to rewrite data of less than the predetermined size when data is written to the flash memory at a target address,
   the controller being further configured to:
      read the data of the predetermined size from the target address as save data;
      store the attribute data and the user data contained in the save data in an isolated manner,
      store rewrite user data obtained by rewriting rewrite-target user data contained in the save data, and
      generate data of the predetermined size, including user data contained in the save data and excepting the rewrite-target user data, the rewrite user data, and the attribute data, and write generated data to the flash memory.

2. The data storage apparatus of claim 1, wherein the controller is configured to generate attribute data associated with the rewrite user data, and to write generated attribute data to the flash memory, with the generated data included in the data of the predetermined size.

3. The data storage apparatus of claim 1, wherein the wherein the minimal unit data is physical block unit data;
   wherein the predetermined size is a cluster comprising a plurality of physical blocks; and
   wherein the data of less than the predetermined size is based on physical block units and smaller than the cluster.

4. The data storage apparatus of claim 1,
   wherein the controller is configured to determine whether a write operation of writing data to the flash memory at a target address is a read-modify-write (RMW) operation, when a write command from a firmware is processed; and
   rewrite the data of less than the predetermined size when the write operation is determined as the RMW operation.

5. The data storage apparatus of claim 1, wherein the controller is configured to detect an error in the save data read from the flash memory, and to interrupt the write operation upon detection of the error.

6. The data storage apparatus of claim 1, wherein the controller is configured to write the save data, attribute data, and rewrite user data to storage areas secured in an internal buffer memory.

7. The data storage apparatus of claim 6, wherein the controller is configured to read data requested by a read command from the internal memory and to transfer the data to a host device, in response to the read command from the host device, after transferring the user data contained in the save data to the internal memory.

8. A method of writing data in a data storage apparatus that comprises a flash memory for which data is written and read in units of a predetermined size, the data of the predetermined size comprising a plurality of minimal unit data items, each including user data and attribute data indicative of a data attribute, wherein
   when data is written to the flash memory at a target address, data of less than the predetermined size is rewritten, the method comprising:
      reading the data of the predetermined size from the target address as save data;
      storing the attribute data and the user data contained in the save data in an isolated manner;
         storing rewrite user data obtained by rewriting rewrite-target user data contained in the save data; and
         generating data of the predetermined size, including user data contained in the save data and excepting the rewrite-target user data, the rewrite user data, and the attribute data, and writing generated data to the flash memory.

9. The method of claim 8, wherein
   data requested by a read command is read from the internal memory and transferred to a host device, in response to the read command from the host device, after the user data contained in the save data is stored in an internal memory.

10. A data control apparatus that writes and reads data to and from a flash memory in units of a predetermined size, the data of the predetermined size comprising a plurality of minimal unit data items, each including user data and attribute data indicative of a data attribute, the data control apparatus comprising:
   a controller configured to rewrite data of less than the predetermined size when data is written to the flash memory at a target address,
   the controller being further configured to:
      read the data of the predetermined size from the target address as save data;
      store the attribute data and the user data contained in the save data in an isolated manner, and
      generate data of the predetermined size, including user data contained in the save data and excepting the rewrite-target user data, the rewrite user data, and the attribute data, and write generated data to the flash memory.

* * * * *